United States Patent [19]

Bross et al.

[11] Patent Number: 5,410,807
[45] Date of Patent: May 2, 1995

[54] HIGH DENSITY ELECTRONIC CONNECTOR AND METHOD OF ASSEMBLY

[75] Inventors: Arthur Bross; Thomas J. Walsh, both of Poughkeepsie, N.Y.

[73] Assignee: International Business Machines Corporation, Armonk, N.Y.

[21] Appl. No.: 219,918

[22] Filed: Mar. 30, 1994

Related U.S. Application Data

[62] Division of Ser. No. 830,874, Feb. 4, 1992, Pat. No. 5,338,208.

[51] Int. Cl.$^6$ .............................................. H01R 9/06
[52] U.S. Cl. ............................... 29/843; 29/840; 174/260; 174/265; 228/179.1; 228/180.1; 439/69
[58] Field of Search ................ 174/260, 265; 439/69; 29/830, 840, 843; 228/179.1, 180.1

[56] References Cited

U.S. PATENT DOCUMENTS

| | | | |
|---|---|---|---|
| 3,077,511 | 2/1963 | Bohrer et al. | 439/69 X |
| 3,148,310 | 9/1964 | Feldman | 174/265 |
| 3,541,222 | 11/1970 | Parks et al. | 174/260 |
| 3,680,037 | 7/1972 | Nellis et al. | 174/265 X |
| 3,835,531 | 9/1974 | Luttmer | 29/830 X |
| 4,897,918 | 2/1990 | Osaki et al. | 29/830 |
| 5,088,639 | 2/1992 | Gondotra et al. | 228/180.1 |
| 5,203,075 | 4/1993 | Angulas et al. | 29/840 X |
| 5,261,155 | 11/1993 | Angulas et al. | 29/830 |
| 5,341,564 | 8/1994 | Akhavain | 29/840 X |

FOREIGN PATENT DOCUMENTS

| | | | |
|---|---|---|---|
| 58-43917 | 9/1983 | Japan | 29/825 |
| 1-278967 | 11/1989 | Japan | 228/179.1 |
| 89/2653 | 3/1989 | WIPO | 29/840 |

OTHER PUBLICATIONS

IBM Tech Disclosure Bull vol 23 No 1 Jun. 1980 pp. 159-160 by W. Dackson et al.

*Primary Examiner*—Carl J. Arbes
*Attorney, Agent, or Firm*—Irwin Ostroff; Edward P. Brandeau

[57] ABSTRACT

There is disclosed a high density electronic connector assembly (system) having a first insulating portion and a second insulating portion adapted to be mated together and held in precise dimensional relation to each other with a suitable steady force. There are a plurality of contact members projecting down beneath the first portion on very close centers. There is a like plurality of socket holes in the second portion, with a respective printed-circuit (conductor) land at the bottom of each hole. Each land is adapted to act as a spring element to establish a minimum normal contact force. Seated in each hole is a small metal ball. Each ball is adapted to press against a respective contact member of the first portion when the upper and lower portions are fully mated. There is also disclosed a method of seating and re-flow soldering the balls to the respective lands in the socket holes.

8 Claims, 2 Drawing Sheets

HIGH DENSITY ELECTRONIC CONNECTOR AND METHOD OF ASSEMBLY

CROSS REFERENCE TO RELATED PATENT APPLICATIONS

This patent application is a divisional patent application of patent application Ser. No. 07/830,874, filed Feb. 4, 1992, now U.S. Pat. No. 5,338,208 issued Aug. 16, 1994.

FIELD OF THE INVENTION

This invention relates to a high performance electronic connector (such as a pin-grid-array carrier and socket) having very high density per unit of area, and to a method of fabrication and utilization of such a connector to achieve improved performance, quality and reliability compared to prior arrangements.

BACKGROUND OF THE INVENTION

In the past decade the density per unit area of electronic devices, such as very large scale integrated circuits (VLSI's), has greatly increased. By some estimates this increase in density has been on the order of 10,000 times what it was earlier. The space or area available outside of a VLSI in which to make the large number of necessary connections to and from it is becoming almost vanishingly small measured by previous standards. Contrary to the density increase of VLSI's, the density of the passive circuit interconnections, such as connectors, has increased (i.e., the parts decreased in size) by only a relatively small factor, for example, less than about 4 to 1. This presents the difficult problem of providing connections to and from the VLSI's which are small enough to fit the spaces available and which are also sufficiently reliable and manufacturable to be economically useful.

As interconnections are made smaller and smaller, the problems associated with manufacturing and assembling these miniature parts seem to grow exponentially. For one thing, a conventional pin and socket connector part, such as a 25 square metal wire-wrap post, has sufficient size and strength to permit it to be made and handled easily with conventional techniques. Typically parts of such "large" size are assembled into connector systems having "large" centers, such as one-tenth by one-tenth inch. But connectors this large and unwieldy are like the "dinosaurs" of a past age in the environment of the VLSI's of today.

The contact resistance of mating parts in an electrical connector is extensively discussed in the literature. See for example the book by Ragnar Holm entitled "Electric Contacts" published by Springer-Verlag. It is highly desirable that the contact resistance remain stable at a very low value (e.g., a few milliohms) throughout the service life of the connector. An important factor in stability of the contact resistance is the character or quality of the interface or mating surfaces of the contacts. These surfaces should be free of contaminants, substantially immune to oxidation or corrosion, and should be held together with sufficient minimum force to insure intimate metal-to-metal contact. These considerations, especially where high quality electronic connectors are involved, lead to the use of gold (or a similar noble metal) in the contact areas and to contact designs which provide normal contact forces for each pair of contacts in the range from about 100 gms to 150 gms (about 4 oz.). The mating forces of the halves of the connector can easily reach a hundred or more pounds where hundreds of pairs of contacts of a single connector are involved. Thus it is highly desirable for a high density connector to minimize the mating or insertion force while maintaining normal contact forces, e.g., about 100 grams.

Where the individual contacts of a connector are made smaller and smaller to achieve higher density, it is more and more difficult to achieve a "safe" minimum contact force. The miniature parts (e.g., pins and sockets) do not have as much mechanical strength as do larger parts. And "strength" usually decreases exponentially rather than linearly as size decreases. Thus all of these factors of size, strength, contact force, uniformity, and stability must be dealt with effectively in designing a high density electronic connector where reliable performance is essential.

One attempt to provide ultra-miniature contacts between mating portions of electrical circuitry is shown in U.S. Pat. No. 3,971,610, to Buchoff et al. in which small individual contact buttons are affixed at selected points to the circuitry to provide mating connections to other parts of the circuitry. These contact buttons are molded of a semi-conductive elastomer, such as silicone rubber, with an admixture of conductive carbon or metal powder. However the volume resistivity of this elastomeric mixture, while low compared to the elastomer material (rubber) alone, is of the order of a million times greater than the volume resistivity of pure copper. Moreover, the elastomer mixture of these contact buttons is far more subject to the ageing effects of elevated temperatures, to physical deterioration over time (oxidation, etc.), and to large, erratic changes in contact resistance, compared to spring contacts of metal. As a result, this elastomeric contact system has had only limited use and is not suitable in applications requiring high performance and where low, stable contact resistance is essential.

It is desirable to provide a high density electronic connector system which provides very low, stable contact resistance together with thermal and mechanical stability, as well as low mating force. It is also desirable to provide an economical and effective method of manufacturing and assembling such a connector system with the precision and uniformity required.

SUMMARY OF THE INVENTION

The present invention is directed to a connector system (assembly). A first insulating portion of the connector system has projecting down from it a plurality of contact members. A second insulating portion of the connector system has a corresponding number of printed-circuit contact "lands" which also serve as individual spring elements. When the first and second portions are mated together, the contact members exert opposing force which flex or bow down the spring lands thereby providing a minimum contact force. This insures low, stable, uniform electrical connections. In one specific embodiment of the invention, the contact members of the first portion of the connector system are thin closely spaced pins. The spring lands are located at the bottom of closely spaced socket holes in the second portion of the connector. Small metal balls are seated in the socket holes against the spring lands. When the connector system portions are mated, the pins bear against the balls which in turn bear against and deflect the spring lands. The balls may by way of example further compensate for dimensional variations by being slightly flattened individually to a greater or less degree. The balls are advantageously covered with gold to provide superior electrical contacts between the pins and lands. In a second embodiment of the invention, the contact members of the first portion of the connector are printed-circuit pads. These pads, when the connector portions are mated together, bear directly on the balls thereby deflecting the spring lands. The balls are advantageously re-flow soldered to the spring lands.

Viewed from one aspect, the present invention is directed to a connector system. The connector system comprises first and second insulating portions adapted to be mated together and held in precise dimensional relation to each other with a suitable steady force. There are a plurality of contact members projecting down beneath the first insulating portion. These members are spaced apart and positioned on the first insulating portion on close centers. There are a plurality of printed circuit traces carried by the second insulating portion, each trace has a respective land which is designed to be a spring and which is adapted to bow or flex down under individual force from a respective contact member when the first and second portions are mated together.

In accordance with another aspect of the invention, a method is provided of assembling and operating a high density electronic connector utilizing a large number of very small metal balls in contact with a like number of contact lands which serve as miniature springs. The method comprises the steps of capturing on precisely spaced centers respective ones of the balls; placing the balls down on the contact lands; captivating the balls to the lands such that electrical joints between balls and lands are obtained; and applying force to each of the balls through a respective contact member to establish individual electrical circuits from a contact member through a ball to a respective land such that each land is deflected and acts to maintain a normal contact force in spite of small dimensional variations.

A better understanding of the invention, together with its important advantages will best be gained from a study of the following description given in conjunction with the accompanying drawing and claims.

DETAILED DESCRIPTION

Figure 1:
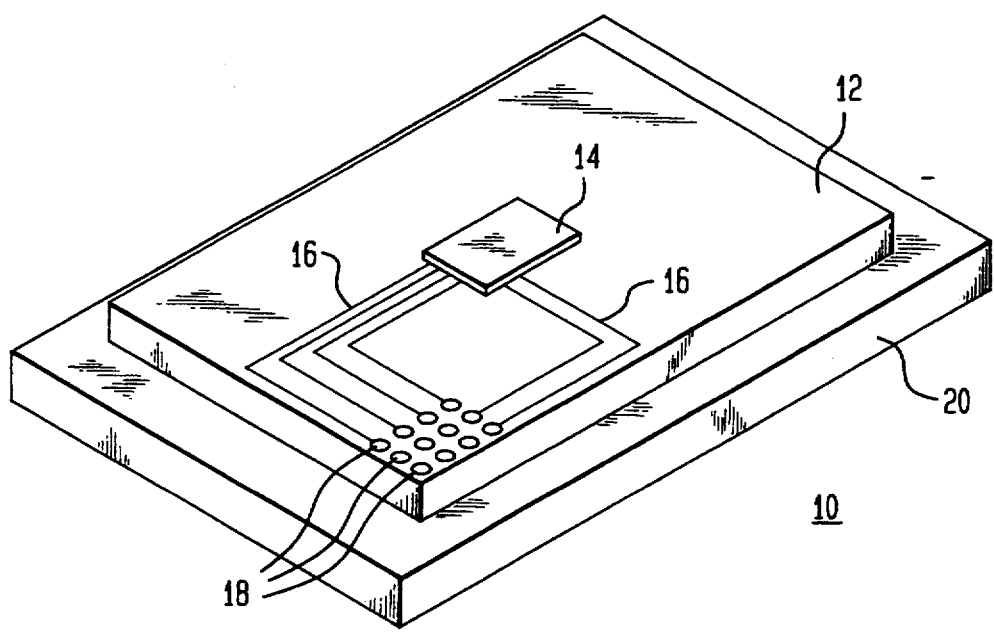
FIG. 1 is a perspective view of a connector assembly (system) embodying features of the invention and showing schematically a VLSI circuit bonded to a top portion of the connector assembly.

Referring now to FIG. 1, there is shown a perspective view of a connector assembly (system) 10 embodying features of the invention. An upper, chip-carrier portion 12 of the assembly 10 has bonded thereto a VLSI circuit 14. The VLSI circuit 14 is connected via a multitude of conductive circuit traces 16 (shown in schematic form) to top ends 18 of closely spaced contact pins 22 (not otherwise shown here but shown on FIG. 2) which extend through and below the upper portion 12 of the connector assembly 10. These contact pins 22 make (ohmic) electrical contact in respective mating sockets (not shown in FIG. 1 but shown in FIG. 2) in a lower socket portion 20 of the assembly 10. There may for example be hundreds of pins and sockets in the upper and lower portions 12 and 20 encompassing an area of only a square inch or so. It is highly desirable that the total insertion force needed to properly mate the sockets and pins of the assembly 10 be kept low. But, it is essential in order to obtain reliable electrical contact that the individual normal forces of the mated contacts be held above a "safe" minimum value.

Figure 2:
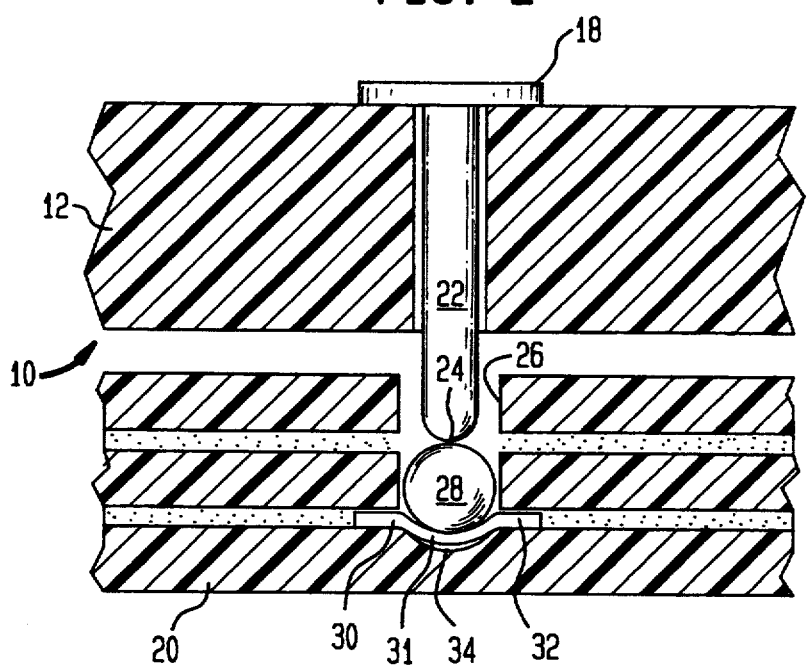
FIG. 2 is a greatly enlarged cross-section view of a portion of the connector assembly of FIG. 1 showing a mating pair of pin and socket contacts.

Referring now to FIG. 2, there is shown an enlarged cross-sectional view of a portion of the assembly 10 which includes a single contact pin 22 with its respective head 18 (see also FIG. 1). The pin 22 is anchored in the upper portion 12 of the connector assembly 10 and projects down through it. The pin 22 has a lower end 24 which projects into a vertical socket hole 26 in the lower connector portion 20. The bottom end 24 of the pin 22 may be rounded as shown and the hole 26 somewhat larger in diameter than the pin 22. This allows for sidewise differential thermal expansion of the parts. In this design, vertical differential thermal expansion is compensated for as will be explained shortly. The connector portions 12 and 20 are typically made of suitable plastic, such as a polymer having high temperature stability and performance. One such polymer is a suitable grade of liquid crystal polymer such as sold by the Amoco, Co. or Hoechst-Celanese.

The bottom end 24 of the contact pin 22 bears against the top of a metal ball 28. The ball 28 is seated on a metal land 30 which is part of a conductive printed-circuit trace 32 carried by the insulating portion 20 of the connector assembly 10. Only a portion of the trace 32 is shown, but it is to be understood that the trace 32 connects to circuitry (not shown) in a conventional manner. Thus an individual electrical connection from the VLSI 14 to this circuitry (not shown) is established via one of the traces 16, a pin 22, a ball 28, a land 30, and a trace 32. If desired, multiple levels of circuit traces 16 and 32 (as in a multi-layer printed circuit board) may be provided in either or both of the connector portions 12 and 20. The reliability of the interconnection between the pin 22, the ball 28, and the land 30 is an important aspect of this invention and will be explained in more detail shortly. Suitable size holes 26 are very precisely drilled into the connector portion 20 to expose the respective lands 30 by suitable means such as a laser. The insertion force of a pin 22 into a socket hole 26 initially requires no force. The pins 22 and respective balls 28 are thus very precisely located relative to each other before the full value of contact force comes into effect. One result of this is that the pins 22 may be very small in diameter, and located on very close centers (e.g., 50 mils or less, X and Y). By way of example, twenty or more pins 22 are very easily accommodated per linear inch, 400 or more pins 22 per square inch.

It will be seen in FIG. 2 that the land 30 is "bowed" at 31 or bent downward from its normal position by the force from the pin 22 against the ball 28. The land 30 is designed in thickness and temper so that it is not bent beyond its elastic limit with this degree of deflection. Thus the land 30 provides a resilient spring acting against the downward force exerted by the pin 22 and the ball 28. It is to be noted that the lower connector portion 20 is "dimpled" or recessed slightly beneath the land 30 as indicated at 34. This dimple 34 permits the land 30 to flex and yet prevents the land 30 from being deflected too far down. Thus, when the upper and lower connector portions 12 and 20 are mated (fully seated together as in FIG. 2), an individual normal contact force is maintained by the spring-action of the land 30. When fully mated as seen in FIG. 2, the pin 22, the ball 28, and the land 30 are stressed and bear against one another with a desired force (above a "safe" minimum contact force). The upper connector portion 12 is held in position relative to the lower connector portion 20 by abutting shoulders (not shown) and by frame members (also not shown) which maintain the necessary total vertical force needed to provide the individual contact forces between each set of mated pins, balls, and lands of the assembly 10.

As mentioned previously, it is desirable in an electronic connector where high reliability is essential, to provide gold (or similar noble metal) on the contact interfaces. This is very easily accomplished here by providing gold on the ends 24 of the pins 22, and gold on the balls 28. Since these areas are so minute, the cost of gold at a suitable thickness (e.g., 50 microinches) is relatively small compared to other contact arrangements. The printed-circuit lands 30 (of copper or a copper alloy) are normally surface plated with a tin-lead alloy of solder. If desired this surface plating may be reflowed when the balls 28 are seated against the lands 30 to provide a "soldered" interface between a ball 28 and a land 30. Reflow is easily accomplished by resistance heating (as will be explained shortly) or by other suitable means. The top portion of each ball 28 remains free of solder.

Figure 3:
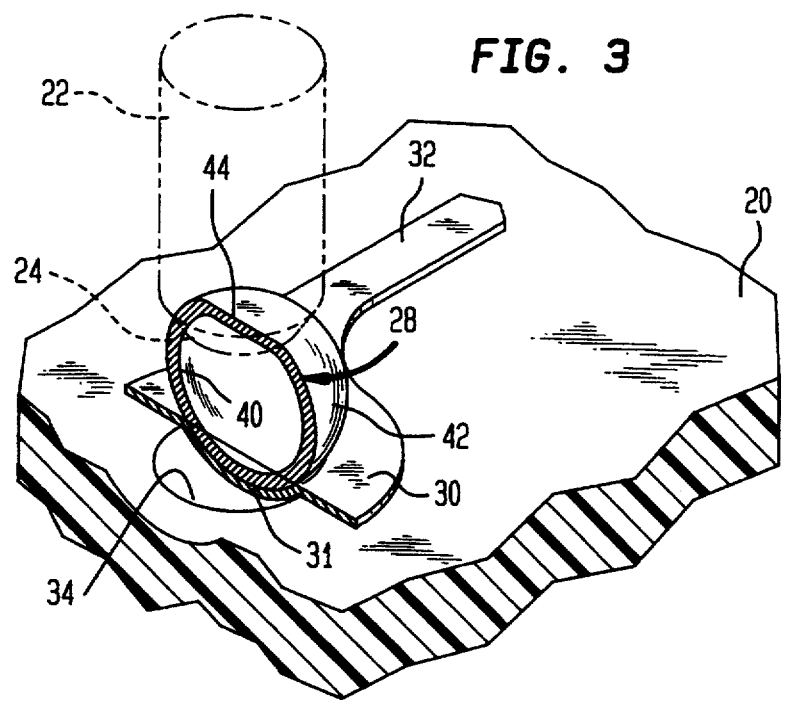
FIG. 3 is a further enlarged perspective view, partly broken away, of the contacts of FIG. 2.

Referring now to FIG. 3, there is shown partially broken away and partly in section a further enlarged view of a ball 28 and a land 30 of FIG. 2. The ball 28 is a hollow sphere having a wall 40. The diameter of the ball 28 is by way of example twelve mils, and the thickness of the wall 40 is two to three mils. The ball 28 may be solid, if desired. The ball 28 may be made of copper or copper alloy. The surface of the ball 28, indicated at 42, is by way of example, covered with gold having a thickness of about 50 microinches. A pin 22 is shown here in dotted outline. Each pin may be about 10 mils thick and have a gold covered end 24. It will be noted that the top of the ball has been somewhat "flattened" over a zone indicated at 44 by the force of the pin 22. This microscopic degree of flattening of the ball 28 further compensates for minute variations in the diameters of the balls 28, in the lengths of the pins 22, etc., and for differential thermal expansion of the parts of the connector assembly 10 in the vertical direction. Normal contact forces from 10 to 150 grams are easily achieved by this arrangement, even though the parts are very small and even though residual dimensional variations are inevitably present.

Figure 4:
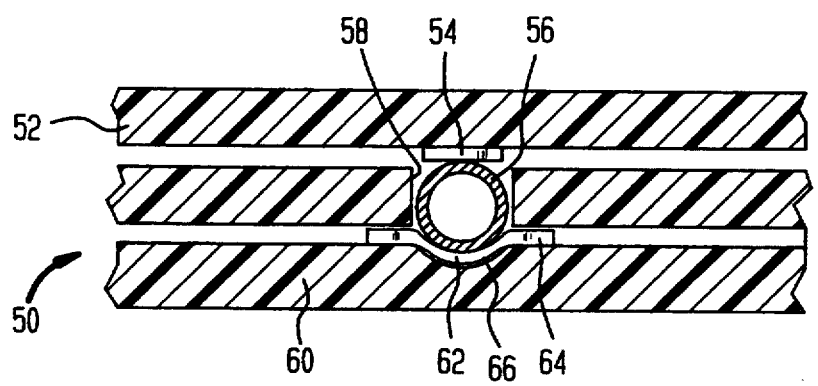
FIG. 4 is a cross-sectional view (similar to FIG. 2) showing a slightly different pair of contacts in accordance with the present invention.

Referring now to FIG. 4, there is shown an enlarged cross-section view of another embodiment of a connector assembly 50 in accordance with the present invention. Connector assembly 50 has an upper portion 52 which has bonded onto a top surface thereof a VLSI (not shown here), and on a lower surface thereof a multitude of closely spaced conductive pads 54 (only one of which is shown). These pads 54 are respectively connected by printed circuit traces (not shown) to a VLSI. Each pad 54 bears against the top of a ball 56. The ball 56 is seated in a socket hole 58 in a lower connector portion 60 of the assembly 50. The bottom of the ball 56 bears against a printed-circuit land 62. The diameter of the ball 56 is large enough so that when the upper and lower portions 52 and 60 of the connector assembly 50 are fully mated or held together as shown, the pad 54 bears against the top of the ball 56 with a desired normal contact force. The ball 56 deflects or bows down the land 62 as shown. The land 62 is connected to a printed-circuit trace 64 (only a portion shown) and there is a dimple indicated at 66 beneath the land 62. This connector assembly 50 is substantially otherwise identical in structure and operation to that of the connector assembly 10 shown in FIG. 1 and to the ball 28 and land 30 previously described and shown in FIGS. 2 and 3.

Figure 5:
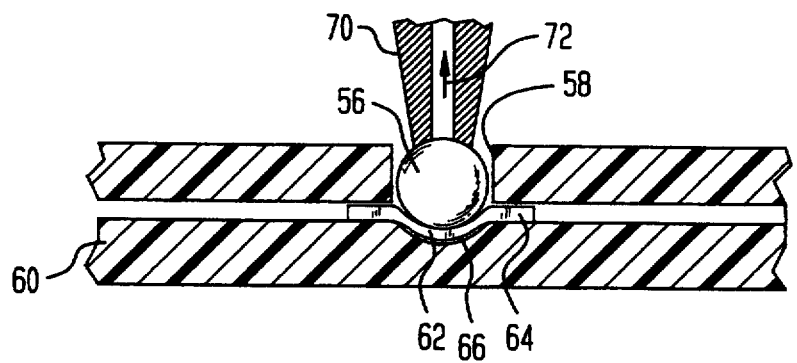
FIG. 5 illustrates a step in the method of manufacturing the connector assembly in accordance with the present invention.

Referring now to FIG. 5, there is schematically shown a step in the method of fabrication of the connector assembly 50 provided in accordance with an aspect of the invention. Each of the balls 56 is picked up on an end of a respective one of closely spaced hollow metal needles 70 (only one of which is shown). By applying vacuum or suction to the hollow metal needle 70, as indicated by an arrow 72, a ball 56 is held as shown against the end of the needle 70. The needles 70 are mounted on-centers corresponding to the centers of the holes 58 on a frame (not shown). Each ball 56 is thus precisely seated in a respective one of the holes 58 in the lower connector portion 60. All of the balls 56 at one time are located and seated into the holes 58 by the needles 70. When so seated, further downward force by each needle 70 against the ball 56 clamps it tightly against the land 62 (which is thus bowed slightly as shown). A momentary electric current through the needle 70, the ball 56, the land 62 and the trace 64, causes the tin-lead plating (not shown) on the land 62 to melt and re-flow. This solders the ball 56 to the land 62. Other suitable means for re-flow may be used if desired. Thus the balls 56 are "soldered" and mechanically captivated in place and can not fall out of the holes 58. The interface between each ball 56 and its land 62 is a precision soldered joint having low, stable electrical resistance. The top surfaces of the balls 56 remain covered by gold and free of solder. It is to be understood that the balls 28 in the connector assembly 10 (FIG. 2) can also be assembled in their holes 26 in the same way as shown in FIG. 5 by using needles 70 of suitable length.

It is to be understood that the apparatus and method described herein are illustrative of the general principles of the invention. Modifications may readily be devised by those skilled in the art without departing from the spirit and scope of the invention. For example, the invention is not limited to a particular number of contacts or size of connector, or to the specific materials described. Balls and pins of different sizes may be used and contact forces other than those disclosed can be used. Still further, seating of the balls in their respective holes and re-flow soldering may be accomplished in other ways than those disclosed.

What is claimed is:

1. A method of assembling an electrical connector comprising a plurality of metal balls having a precious contact metal on an outer surface thereof and a plurality of solder plated contact lands which serve as miniature springs and lie on spaced centers, the method comprising the steps of:

capturing on said spaced centers respective ones of the balls;

captivating the balls to respective ones of the contact lands with sufficient force to cause the contact lands to deflect and to obtain electrical and mechanical contact between the balls and the contact lands; and re-flow soldering the balls to the lands while the lands are deflected to cause soldered joints between the balls and lands while leaving portions of the precious contact metal on each of the balls exposed such that stable low resistance electrical connections to the exposed portions of the balls can thereafter be made and un-made a plurality of times.

2. The method of claim 1 wherein the balls are individually captured on the respective ends of hollow metal needles when suction is applied to the needles, and re-flow soldering is effected by applying an electric current through each respective needle, ball, and land.

3. A method of assembling and operating a high density electrical connector comprising a plurality of copper metal balls in contact with a like number of contact lands, each ball having a diameter of the order of 12 mils and having a coating of precious contact metal such as gold, each land being solder coated, the lands lying on centers of about 50 mils or less, the method comprising the steps of:

captivating the balls to the lands with a sufficient force such that mechanical and electrical connections between balls and lands are obtained;

re-flow soldering the balls to the lands while the force is applied so as to solder the balls and lands together with a portion of the precious contact metal on each of the balls being exposed; and removably contacting with a force greater than about 10 grams exposed precious contact metal on each of the balls with a respective contact member having a coating of precious contact metal such as gold to establish electrical connections from a respective contact member through a ball to a land such that stable low insertion force electrical circuit connections can thereafter be un-made and re-made a plurality of times between the respective contact members and the balls and lands.

4. The method of claim 3 wherein an electric current is passed through a ball and a land to effect the re-flow soldering.

5. A method of assembling and operating an electrical connector utilizing a plurality of metal covered balls, each of the balls being in contact with a solder coated contact land which serves as a miniature spring, the method comprising the steps of:

capturing on precisely spaced centers respective ones of the balls;

placing the balls down on the contact lands;

captivating the balls to the lands such that electrical connections between balls and lands are obtained;

contacting under a contact force each of the balls with a respective contact member to establish individual electrical paths from a contact member through a ball to a respective land such that each land is deflected and acts with a spring force against the contact force; and re-flow soldering the balls to the lands by passing an electric current through them such that precision soldered joints between the balls and lands are obtained.

6. The method of claim 5 wherein the balls are individually captured on the respective ends of hollow metal needles when suction is applied thereto, and an electric current is passed through a needle, a ball, and a land to effect the re-flow soldering.

7. A method of assembling an electrical connector comprising a plurality of metal balls and a plurality of solder plated contact lands which lie on spaced centers, the method comprising the steps of:

capturing on the ends of needle-like metal members respective ones of the balls;

captivating the balls to the contact lands with sufficient force to obtain electrical and mechanical contact between the balls and the contact lands; and re-flow soldering the balls to the lands by passing an electric current through the needle-like members to effect soldered joints between the balls and lands.

8. The method in claim 7 wherein the needle-like members are hollow needles, and the balls are captured on the ends of the needles by applying suction.

* * * * *